US011551931B2

(12) United States Patent
Kagawa et al.

(10) Patent No.: US 11,551,931 B2
(45) Date of Patent: Jan. 10, 2023

(54) SUBSTRATE PROCESSING APPARATUS, SUBSTRATE PROCESSING METHOD, AND STORAGE MEDIUM STORING PROGRAM FOR EXECUTING SUBSTRATE PROCESSING METHOD

(71) Applicant: TOKYO ELECTRON LIMITED, Tokyo (JP)

(72) Inventors: Koji Kagawa, Koshi (JP); Takayuki Toshima, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 387 days.

(21) Appl. No.: 16/769,179

(22) PCT Filed: Dec. 7, 2018

(86) PCT No.: PCT/JP2018/045099
§ 371 (c)(1),
(2) Date: Jun. 2, 2020

(87) PCT Pub. No.: WO2019/112042
PCT Pub. Date: Jun. 13, 2019

(65) Prior Publication Data
US 2021/0217620 A1    Jul. 15, 2021

(30) Foreign Application Priority Data
Dec. 7, 2017    (JP) .............................. JP2017-235212

(51) Int. Cl.
*H01L 21/033*    (2006.01)
*H01L 21/02*    (2006.01)
(Continued)

(52) U.S. Cl.
CPC .... *H01L 21/0337* (2013.01); *H01L 21/02118* (2013.01); *H01L 21/32138* (2013.01); *H01L 21/32139* (2013.01); *H01L 21/6715* (2013.01)

(58) Field of Classification Search
CPC .......... H01L 21/0337; H01L 21/02118; H01L 21/32138; H01L 21/32139; H01L 21/6715;
(Continued)

(56) References Cited

U.S. PATENT DOCUMENTS

2014/0331927 A1*  11/2014  Nakano ............. H01L 21/68728
118/620

FOREIGN PATENT DOCUMENTS

| JP | 2004-146594 A | 5/2004 |
| JP | 2010-114210 A | 5/2010 |
| JP | 2013-207080 A | 10/2013 |

* cited by examiner

*Primary Examiner* — Karen Kusumakar
(74) *Attorney, Agent, or Firm* — Nath, Goldberg & Meyer; Jerald L. Meyer; Tanya E. Harkins

(57) ABSTRACT

A substrate processing method includes (A) supplying to the substrate a first processing liquid containing a removing agent for deposit, a solvent having a boiling point lower than that of the removing agent and a thickener, (B), after (A), supplying to the substrate a second processing liquid containing an organic polymer to be a gas diffusion barrier film, (C), after (B), heating the substrate at a predetermined temperature equal to or higher than the boiling point of the solvent and lower than the boiling point of the removing agent to promote evaporation of the solvent and reaction between the deposit and the removing agent, and (D), after (C), supplying a rinsing liquid to the substrate to remove the deposit from the substrate. The gas diffusion barrier film prevents a gaseous reactive product generated by the reaction in (C) from diffusing around the substrate.

20 Claims, 7 Drawing Sheets

(51) Int. Cl.
*H01L 21/3213* (2006.01)
*H01L 21/67* (2006.01)

(58) Field of Classification Search
CPC ......... H01L 21/67051; H01L 21/67115; H01L 21/31111; H01L 21/02063; H01L 21/02071; B08B 3/02
See application file for complete search history.

BAKE

SUBSTRATE PROCESSING APPARATUS, SUBSTRATE PROCESSING METHOD, AND STORAGE MEDIUM STORING PROGRAM FOR EXECUTING SUBSTRATE PROCESSING METHOD

This is a National Phase Application filed under 35 U.S.C. 371 as a national stage of PCT/JP2018/045099, filed Dec. 7, 2018, an application claiming the benefit of Japanese Application No. 2017-235212, filed Dec. 7, 2017, the content of each of which is hereby incorporated by reference in its entirety.

TECHNICAL FIELD

The present disclosure relates to a substrate processing apparatus and a substrate processing method for removing deposits adhering to a substrate from the substrate, and a storage medium storing a program for executing the substrate processing method.

BACKGROUND

In a process of manufacturing a semiconductor device, a process is performed to etch an etching target film (e.g., an interlayer insulating film, a metal film, etc.) formed on a substrate such as a semiconductor wafer or the like using a resist film as a mask material and pattern the film into a predetermined pattern.

Meanwhile, in recent years, attention has been paid to a Cu multilayer wiring technique that makes use of a low dielectric constant film (low-k film) as an interlayer insulating film. In such a Cu multilayer wiring technique, a dual damascene method is employed in which embedded wiring trenches or holes are formed in the low-k film and Cu is embedded in the embedded wiring trenches or holes. As a low-k film, an organic low-k film is often used. When such an organic low-k film is etched, a sufficient selectivity of the organic low-k film with respect to a resist film which is also an organic film cannot be obtained. Therefore, an inorganic hard mask film such as a Ti film, a TiN film, or the like is used as a mask material for etching. That is, the hard mask film is etched in a predetermined pattern using a resist film as a mask material, and the low-k film is etched using the hard mask film etched in the predetermined pattern as a mask material.

After etching, it is necessary to remove unnecessary deposits such as a resist film, a hard mask film, or the like remaining on the substrate. The removal of such unnecessary deposits is performed by, for example, continuously supplying a removal liquid to the center of a semiconductor wafer as a target substrate by a single-wafer-type cleaning apparatus while rotating the semiconductor wafer, and spreading the removal liquid over the entire surface of the semiconductor wafer by a centrifugal force (see e.g., Patent Document 1, Patent Document 2 and Patent Document 3).

PRIOR ART DOCUMENTS

Patent Documents

Patent Document 1: Japanese laid-open publication No. 2004-146594
Patent Document 2: Japanese laid-open publication No. 2010-114210
Patent Document 3: Japanese laid-open publication No. 2013-207080

The present disclosure provides some embodiments of a technique capable of effectively removing deposits (e.g., a resist film, a hard coat film, etc.) adhering to a substrate from the substrate.

SUMMARY

According to one embodiment of the present disclosure, there is provided a substrate processing apparatus for removing a deposit on a substrate from the substrate, including: a removal processing part including a first processing liquid supply part configured to supply the substrate with a first processing liquid containing a removing agent for the deposit, a solvent having a boiling point lower than a boiling point of the removing agent and a thickener, a second processing liquid supply part configured to supply a second processing liquid for forming a gas diffusion barrier film to the substrate to which the first processing liquid is supplied, a substrate heating part configured to heat the substrate to which the second processing liquid is supplied, at a predetermined temperature equal to or higher than the boiling point of the solvent and lower than the boiling point of the removing agent, and a rinsing liquid supply part configured to supply a rinsing liquid to the substrate; and a controller configured to control the first processing liquid supply part, the second processing liquid supply part, the substrate heating part and the rinsing liquid supply part so that the first processing liquid supply part supplies the first processing liquid to the substrate, subsequently, the second processing liquid supply part supplies the second processing liquid to the substrate, and subsequently, the substrate heating part heats the substrate at the predetermined temperature, so as to promote evaporation of the solvent and reaction between the deposit and the removing agent, and so that the rinsing liquid supply part supplies the rinsing liquid to the substrate, so as to remove the deposit from the substrate, wherein the gas diffusion barrier film prevents a gaseous reactive product generated by the reaction between the deposit and the removing agent from diffusing around the substrate.

According to another embodiment of the present disclosure, there is provided a substrate processing method of removing a deposit on a substrate from the substrate, including: (A) supplying to the substrate a first processing liquid containing a removing agent for the deposit, a solvent having a boiling point lower than a boiling point of the removing agent and a thickener; (B), after (A), supplying to the substrate a second processing liquid containing an organic polymer to be a gas diffusion barrier film; (C), after (B), heating the substrate at a predetermined temperature equal to or higher than the boiling point of the solvent and lower than the boiling point of the removing agent to promote evaporation of the solvent and reaction between the deposit and the removing agent; and (D), after (C), supplying a rinsing liquid to the substrate to remove the deposit from the substrate, wherein the gas diffusion barrier film prevents a gaseous reactive product generated by the reaction between the deposit and the removing agent in (C) from diffusing around the substrate.

According to another embodiment of the present disclosure, there is provided a storage medium storing a program that, when executed by a computer for controlling an operation of a substrate processing apparatus, causes the computer to control the substrate processing apparatus to execute the aforementioned substrate processing method.

According to the substrate processing apparatus and the substrate processing method of the present disclosure, it is possible to effectively remove the deposit (e.g., a resist film, a hard coat film, etc.) adhering to the substrate from the substrate. In addition, the gas diffusion barrier film prevents a gaseous reactive product, which may be generated by the reaction between the deposit and the removing agent at the time of heating the substrate, from diffusing around the substrate through the gas diffusion barrier film. Therefore, even if the gaseous reactive product is corrosive, it is possible to prevent the components of the processing apparatus from being damaged by the reactive product, and to prevent particles from being generated from the reactive product.

DETAILED DESCRIPTION

Embodiments of the present disclosure will now be described with reference to the accompanying drawings.
<Configuration of Substrate Processing Apparatus>

Figure 1:
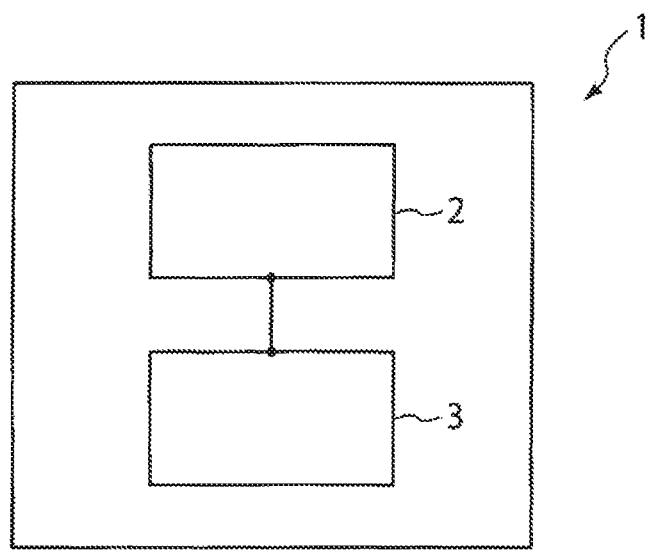
FIG. 1 is a schematic diagram showing a configuration of a substrate processing apparatus according to an embodiment of the present disclosure.

A configuration of a substrate processing apparatus according to an embodiment of the present disclosure will be described with reference to FIG. 1. FIG. 1 is a schematic diagram showing the configuration of the substrate processing apparatus according to the embodiment of the present disclosure.

As shown in FIG. 1, the substrate processing apparatus 1 according to the embodiment of the present disclosure includes a substrate processing unit 2 and a control unit 3 configured to control the operation of the substrate processing unit 2.

The substrate processing unit 2 performs various processes on a substrate. The various processes performed by the substrate processing unit 2 will be described later.

The control unit 3 is, for example, a computer and includes a control part and a memory part. The control part is, for example, a CPU (Central Processing Unit), and controls the operation of the substrate processing unit 2 by reading and executing a program stored in the memory part. The memory part is configured by a storage device such as a RAM (Random Access Memory), a ROM (Read Only Memory), a hard disk or the like, and stores a program for controlling various processes executed in the substrate processing unit 2. The program may be recorded in a computer-readable storage medium, or may be installed on the memory part from the storage medium. Examples of the computer-readable storage medium may include a hard disk (HD), a flexible disk (FD), a compact disk (CD), a magneto-optical disk (MO), a memory card, and the like. The storage medium stores, for example, a program for, when executed by the computer for controlling the operation of the substrate processing apparatus 1, causing the computer to control the substrate processing apparatus 1 to execute a substrate processing method to be described later.
<Configuration of Substrate Processing Unit>

Figure 2:
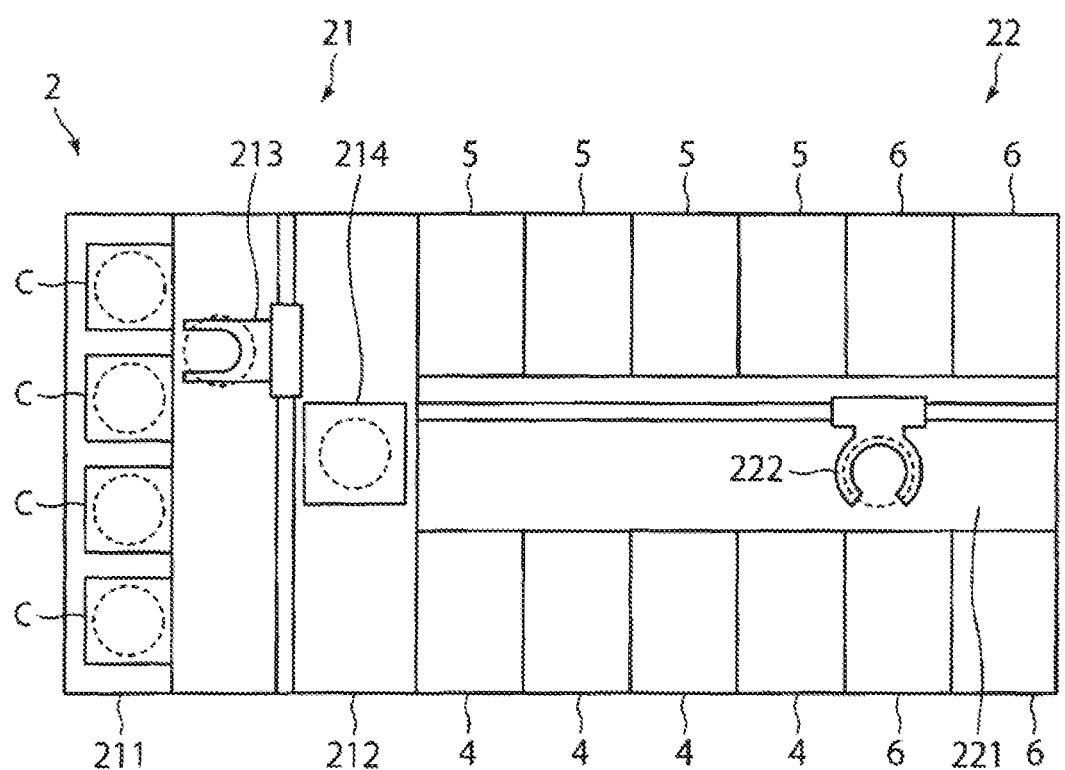
FIG. 2 is a schematic plan view showing a configuration of a substrate processing unit included in the substrate processing apparatus shown in FIG. 1.

Next, the configuration of the substrate processing unit 2 will be described with reference to FIG. 2. FIG. 2 is a schematic plan view showing the configuration of the substrate processing unit 2. The broken lines in FIG. 2 indicate substrates.

The substrate processing unit 2 performs various processes on the substrate. In the present embodiment, the substrate processing unit 2 performs a removal process for removing a hard mask film on the substrate after a dry etching process. The process performed by the substrate processing unit 2 is not particularly limited as long as it includes a process of removing a hard mask film formed on the substrate from the substrate. The process performed by the substrate processing unit 2 may include other processes. In the present embodiment, the hard mask film on the substrate after dry etching is to be removed. However, the hard mask film is nothing more than an example of deposits on a substrate. Other specific examples of deposits on the substrate include an unnecessary organic, inorganic or organic-inorganic composite film (e.g., a resist film, an antireflection film, or the like) remaining on the substrate after dry etching, a by-product generated during etching (e.g., a polymer derived from an etching gas, a resist film, a hard mask film, or the like), a resist residue generated at the time of ashing the resist film, and the like. The deposit on the substrate to be removed in the present disclosure is not limited to deposits on the substrate after dry etching, and may be, for example, a cured resist layer after ion implantation.

The substrate processing unit 2 includes a loading/unloading station 21 and a processing station 22 provided adjacent to the loading/unloading station 21.

The loading/unloading station 21 includes a mounting part 211 and a transfer part 212 provided adjacent to the mounting part 211.

A plurality of transfer containers (hereinafter referred to as "carriers C") in which a plurality of substrates is accommodated in a horizontal state is mounted on the mounting part 211.

The transfer part 212 includes a transfer mechanism 213 and a delivery part 214. The transfer mechanism 213 includes a holding mechanism for holding the substrate, and is configured to be movable in a horizontal direction and a vertical direction and to be swingable about a vertical axis.

The processing station 22 includes first processing parts 4 configured to supply a processing liquid to the substrates, second processing parts 5 configured to heat the substrates to which the processing liquid is supplied by the first processing parts 4, and third processing parts 6 configured to supply a rinsing liquid to the substrates heated by the second processing parts 5. In the present embodiment, the number of the first processing parts 4 included in the processing station 22 is two or more. However, the number of the first processing parts 4 may be one. This also holds true for the second processing parts 5 and the third processing parts 6. The first processing parts 4 are arranged on one side of a transfer path 221 extending in a predetermined direction, and the second processing parts 5 are arranged on the other side of the transfer path 221. Furthermore, the third processing parts 6 are arranged on both sides of the transfer path 221. The arrangements adopted in the present embodiment are exemplary. The arrangements of the first to third processing parts may be arbitrarily determined according to the reasons of design and operation.

A transfer mechanism 222 is provided in the transfer path 221. The transfer mechanism 222 includes a holding mechanism configured to hold the substrate. The transfer mechanism 222 is configured to be movable in a horizontal direction and a vertical direction and to be swingable about a vertical axis.

Hereinafter, the substrate not supplied with a first processing liquid L1 and a second processing liquid L1A by the first processing part 4 will be referred to as a "substrate W1", the substrate supplied with the first processing liquid L1 and the second processing liquid L1A by the first processing part 4 and not heated by the second processing part 5 will be referred to as a "substrate W2", the substrate heated by the second processing part 5 and not supplied with a rinsing liquid L2 will be referred to as a "substrate W3", and the substrate supplied with the rinsing liquid L2 by the third processing part 6 will be referred to as a "substrate W4".

In the substrate processing unit 2, the transfer mechanism 213 of the loading/unloading station 21 is configured to transfer the substrates W1 and W4 between the carrier C and the delivery part 214. Specifically, the transfer mechanism 213 unloads the substrate W1 from the carrier C mounted on the mounting part 211 and mounts the unloaded substrate W1 on the delivery part 214. Furthermore, the transfer mechanism 213 takes out the substrate W4 mounted on the delivery part 214 by the transfer mechanism 222 of the processing station 22 and stores the same in the carrier C of the mounting part 211.

In the substrate processing unit 2, the transfer mechanism 222 of the processing station 22 is configured to transfer the substrates W1 to W4 between the delivery part 214 and the first processing part 4, between the first processing part 4 and the second processing part 5, between the second processing part 5 and the third processing part 6, and between the third processing part 6 and the delivery part 214. Specifically, the transfer mechanism 222 unloads the substrate W1 mounted on the delivery part 214 and loads the unloaded substrate W1 into the first processing part 4. Furthermore, the transfer mechanism 222 unloads the substrate W2 from the first processing part 4 and loads the unloaded substrate W2 into the second processing part 5. Moreover, the transfer mechanism 222 unloads the substrate W3 from the second processing part 5 and loads the unloaded substrate W3 into the third processing part 6. In addition, the transfer mechanism 222 unloads the substrate W4 from the third processing part 6 and mounts the unloaded substrate W4 on the delivery part 214.

<Configuration of First Processing Part>

Figure 3:
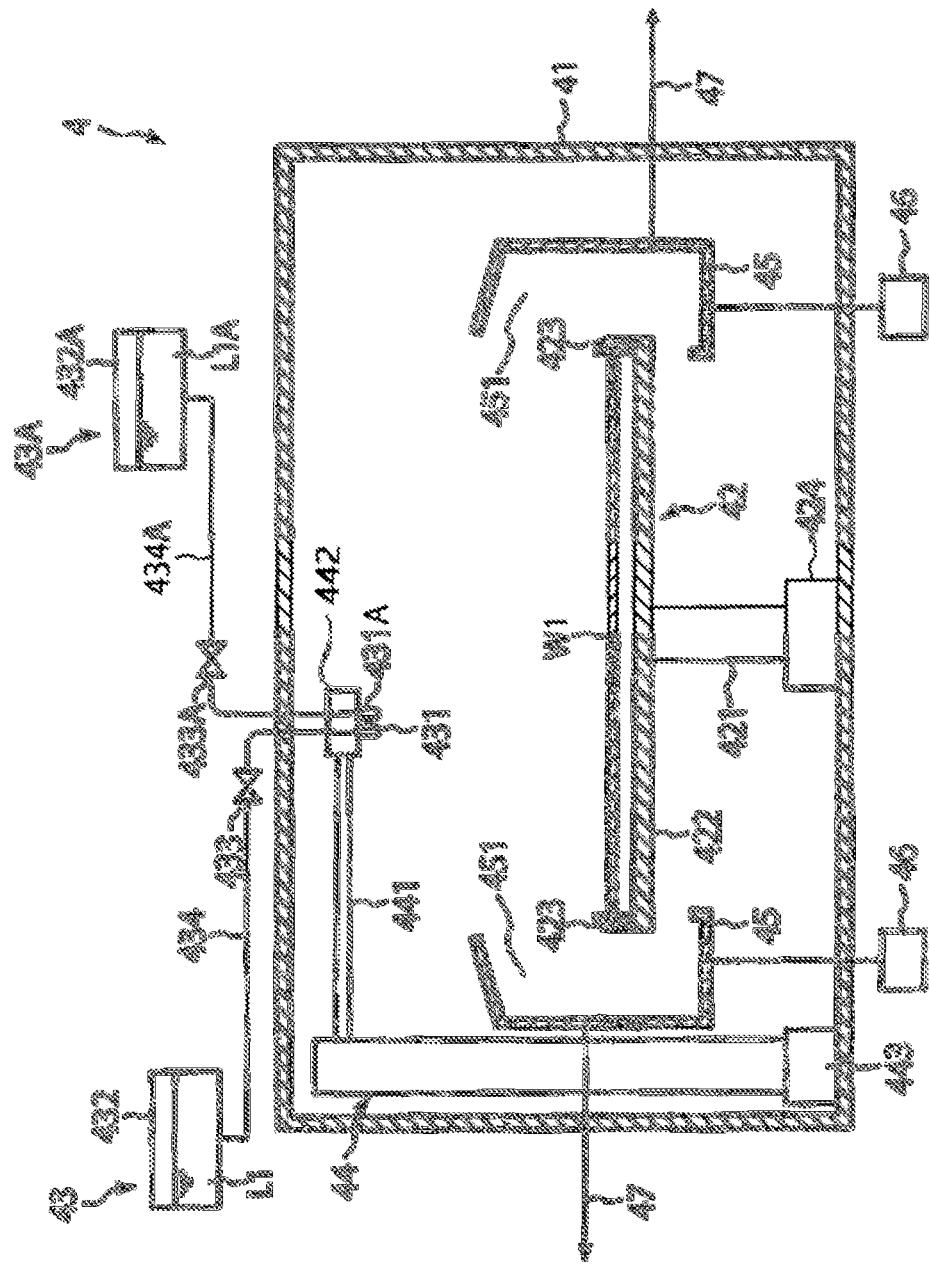
FIG. 3 is a schematic cross-sectional view showing a configuration of a first processing part included in the substrate processing unit shown in FIG. 2.

Next, a configuration of the first processing part 4 will be described with reference to FIG. 3. FIG. 3 is a schematic sectional view showing the configuration of the first processing part 4.

The first processing part 4 performs a process including supplying the processing liquid to the substrate W1. The process performed by the first processing part 4 may include other processes.

In the present embodiment, the substrate W1 is a substrate subjected to a dry etching process and has an uneven pattern on a front surface thereof. An example of the structure of the substrate W1 is shown in FIG. 6D. As shown in FIG. 6D, the substrate W1 includes, for example, a semiconductor wafer 91, an etching target film 92, and a hard mask film 93 in order. The etching target film 92 and the hard mask film 93 are patterned into a predetermined pattern by a dry etching process to form an uneven pattern on the front surface of the substrate W1. The semiconductor wafer 91 is, for example, a silicon wafer. The etching target film 92 is, for example, an insulating film, a conductor film, or the like. The insulating film is, for example, a silicon-based insulating film such as a $SiO_2$ film or a low dielectric constant film called a low-k film. The low-k film is, for example, a film having a relative dielectric constant lower than that of silicon dioxide, such as a SiOC film, a SiCOH film, or the like. The conductor film is, for example, a metal film such as a Cu film or an Al film. The hard mask film 93 is, for example, an inorganic hard mask film, an organic hard mask film, an organic-inorganic composite hard mask film, or the like.

Examples of the inorganic material constituting the inorganic hard mask film may include titanium (Ti), titanium nitride (TiN), silicon oxide ($SiO_2$), silicon nitride ($Si_3N_4$), silicon oxynitride (SiON), silicon nitride (SiN), silicon carbide (SiC), silicon carbonitride (SiCN), and the like.

Examples of the organic material constituting the organic hard mask film may include amorphous carbon, novolac resin, polyhydroxystyrene-based resin, and the like.

Examples of the organic-inorganic composite material constituting the organic-inorganic hard mask film may include copolymers of polycarbosilane, organopolysilazane, organopolysilane, polysiloxane and metal oxides (titanium oxide, aluminum oxide, tungsten oxide, etc.), and the like.

Figure 6A:
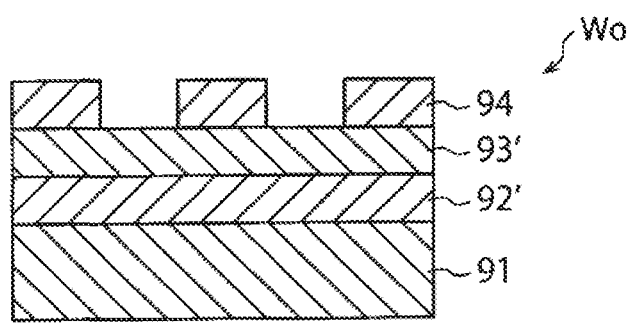
FIGS. 6A to 6D are schematic cross-sectional views for explaining a dry etching process.

The substrate W1 is obtained, for example, by dry-etching a raw material substrate W0 shown in FIG. 6A. The raw material substrate W0 includes, in order, the semiconductor wafer 91, an etching target film 92', a hard mask film 93', and a photoresist film 94 patterned into a predetermined pattern by a photolithography process. The etching target film 92' and the hard mask film 93' have not yet been patterned into the predetermined pattern.

Figure 6B:
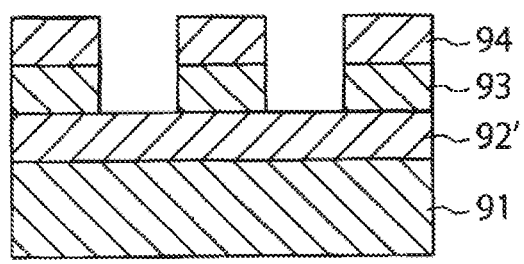

The dry etching process of the raw material substrate W0 is performed as follows, for example. First, as shown in FIG. 6B, the hard mask film 93' is dry-etched using the photoresist film 94 as a mask material. As a result, the pattern of the photoresist film 94 is transferred onto the hard mask film 93', whereby the hard mask film 93 patterned into the predetermined pattern is formed.

Figure 6C:
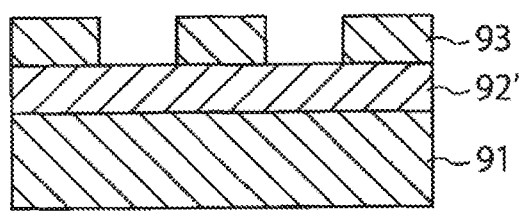
Figure 6D:
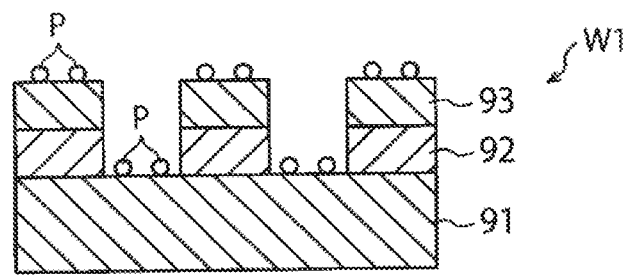

Subsequently, as shown in FIG. 6C, the photoresist film 94 is removed by an ashing process.

Subsequently, as shown in FIG. 6D, the etching target film 92' is dry-etched using the hard mask film 93 as a mask material. As a result, the etching target film 92 patterned into the predetermined pattern is formed.

The dry etching process may be anisotropic etching or isotropic etching. Examples of the etching method used in the dry etching process may include an ECR etching method, an ICP etching method, a CCP etching method, a Helicon etching method, a TCP etching method, a UHF plasma method, a SWP etching method, and the like.

As shown in FIG. 6D, in some cases, substances P such as a by-product (e.g., a polymer derived from the etching gas, the resist film, the hard mask film, and the like) generated during the etching, a resist residue generated during the ashing of the resist film, and the like adhere to the substrate W1.

The first processing part 4 includes a chamber 41 and performs a substrate process including supply of a processing liquid in the chamber 41.

The first processing part 4 includes a substrate holding part 42. The substrate holding part 42 includes a rotation shaft 421 extending in the vertical direction inside the chamber 41, a turntable 422 attached to the upper end of the rotation shaft 421, a chuck 423 provided on an outer periphery of an upper surface of the turntable 422 to support an outer edge portion of the substrate W1, and a drive part 424 configured to rotationally drive the rotation shaft 421. The substrate holding part 42 is rotatable while holding the substrate W1.

The substrate W1 is supported by the chuck 423, and is horizontally held on the turntable 422 while being slightly spaced apart from the upper surface of the turntable 422. In the present embodiment, the method of holding the substrate W1 by the substrate holding part 42 is a so-called mechanical chuck type in which the outer edge portion of the substrate W1 is held by the movable chuck 423. However, the method of holding the substrate W1 by the substrate holding part 42 may be a so-called vacuum chuck type in which a back surface of the substrate W1 is held by vacuum suction.

A base end portion of the rotation shaft 421 is rotatably supported by the drive part 424, and a tip end portion of the rotation shaft 421 horizontally supports the turntable 422. As the rotation shaft 421 rotates, the turntable 422 attached to the upper end portion of the rotation shaft 421 rotates, whereby the substrate W1 held by the turntable 422 while being supported by the chuck 423 rotates. The control part 3 controls the operation of the drive part 424, and controls the rotation timing, the rotation speed, and the like of the substrate W1.

The first processing part 4 includes a first processing liquid supply part 43 configured to supply the first processing liquid L1 to the substrate W1 held by the substrate holding part 42.

The first processing liquid supply part 43 includes a nozzle 431 configured to discharge the first processing liquid L1 to the substrate W1 held by the substrate holding part 42, and a processing liquid source 432 configured to supply the first processing liquid L1 to the nozzle 431. The first processing liquid L1 is stored in a tank included in the processing liquid source 432. The first processing liquid L1 is supplied from the processing liquid source 432 to the nozzle 431 through a supply pipeline 434 in which a flow rate regulator such as a valve 433 and the like is provided. The first processing part 4 may include a plurality of processing liquid supply parts configured to supply different processing liquids. Such additional processing liquid supply parts may be configured similarly to the first processing liquid supply part 43.

The first processing liquid L1 contains a removing agent for the hard mask film 93 (hereinafter sometimes simply referred to as "removing agent"), a solvent having a boiling point lower than that of the removing agent, and a thickener. In this embodiment, the removing agent for the hard mask film 93 will be described because the hard mask film 93 is a removal target. However, the description on the removing agent for the hard mask film 93 may be applied to removing agents for other deposits on the substrate by replacing the removing agent for the hard mask film 93 with removing agents for other deposits on the substrate, for example, a removing agent for an unnecessary organic, inorganic or organic-inorganic composite film (e.g., a resist film, an antireflection film, or the like) remaining on the substrate after dry etching, a removing agent for a by-product (e.g., a polymer derived from an etching gas, a resist film, a hard mask film, or the like) generated during etching, a removing agent for a resist residue generated during ashing of the resist film, a removing agent for a cured resist layer after ion implantation, and the like. Similarly, the description regarding the solvent contained in the first processing liquid L1 may be applied to solvents contained in the processing liquid for removing other deposits.

The removing agent may be appropriately selected from known removing agents according to the type of material of a deposit (the hard mask film 93 in the present embodiment) to be removed. In the photolithography field, various removing agents are known for removing an unnecessary organic, inorganic or organic-inorganic composite film (e.g., a resist film, an antireflection film, or the like) remaining on a substrate after dry etching, a by-product (e.g., a polymer derived from an etching gas, a resist film, a hard mask film, or the like) generated during etching, a resist residue generated during ashing of a resist film, a cured resist layer after ion implantation, and the like (see, e.g., Japanese laid-open publication No. 7-28254, Japanese laid-open publication No. 9-301911, Japanese laid-open publication No. 10-239865, Japanese laid-open publication No. 2001-324823, Japanese laid-open publication No. 2004-103771, Japanese laid-open publication No. 2004-133153, Japanese laid-open publication No. 2004-177669, Japanese laid-open publication No. 2016-27186, International Publication Pamphlet No. WO2007/020979, and International Publication Pamphlet No. WO2009/096480). Known removing agents are usually limited to suitable removal targets. However, when the known removing agents are used in the present disclosure, the removal targets of the present disclosure are not limited thereto. That is, when the known removing agents are used in the present disclosure, it is possible to effectively (e.g., quickly) remove removal targets similar to those of the known removing agents, and to remove removal targets different from those of the known removing agents.

The action mechanism of the removing agent is not particularly limited. Examples of the action mechanism of the removing agent may include dissolution of a deposit (the hard mask film 93 in the present embodiment) to be removed, reduction of an adhesion force of a deposit (the hard mask film 93 in the present embodiment) to be removed, reduction of a molecular weight of a deposit (the hard mask film 93 in the present embodiment) to be removed, introduction of functional groups having an affinity to the rinsing liquid L2 into a deposit (the hard mask film 93 in the present embodiment), and the like. Therefore, the removing agent is a concept that includes a releasing agent, a dissolving agent, and the like.

When the hard mask film 93 is made of an inorganic material, examples of the removing agent may include hydrogen peroxide, hydrochloric acid, and the like.

When the hard mask film 93 is made of an organic material and/or an organic-inorganic composite material, examples of the removing agent may include quaternary ammonium hydroxide, water-soluble amine, hydrogen peroxide, sulfuric acid, hydrogen fluoride, and the like, one of which may be used alone, or two or more of which may be used in combination as long as the removal performance is exhibited. Examples of the combination of two or more types capable of exhibiting the removal performance may include a combination of quaternary ammonium salt and water-soluble amine, a combination of hydrogen peroxide and sulfuric acid, and the like.

Examples of the quaternary ammonium hydroxide may include tetramethylammonium hydroxide (TMAH).

Examples of the water-soluble amine may include alkanolamines such as monoethanolamine and the like.

The solvent contained in the first processing liquid L1 is not particularly limited as long as it has a boiling point lower than that of the removing agent, and may be appropriately selected from known solvents.

When two or more types of removing agents are contained in the first processing liquid L1, a solvent having a boiling point lower than that of the removing agent having the lowest boiling point among all the removing agents contained in the first processing liquid L1 is selected.

When two or more types of solvents are contained in the first processing liquid L1, the two or more types of solvents are selected so that the boiling point of the mixed solution of the solvents is lower than the boiling point of the removing agent.

Examples of the solvent contained in the first processing liquid L1 may include water, water-soluble organic solvent, and the like, one of which may be used alone, or two or more of which may be used in combination.

Examples of the water-soluble organic solvent may include sulfoxides such as dimethyl sulfoxide and the like.

Specific examples of the first processing liquid L1 may include a mixture of quaternary ammonium salt and water, a mixture of quaternary ammonium salt, water-soluble organic solvent such as dimethyl sulfoxide or the like and water, and a mixture of quaternary ammonium hydroxide, alkanolamine, water-soluble organic solvent such as dimethyl sulfoxide or the like, and water.

The thickener is not particularly limited as long as it can increase the viscosity of the first processing liquid L1, and may be appropriately selected from known thickeners. Examples of the thickener may include methyl cellulose, carboxymethyl cellulose, polyethylene glycol, sodium polyacrylate, polyvinyl alcohol, and the like, one of which may be used alone, or two or more of which may be used in combination.

In the present embodiment, a thickener having a glass transition point, which is higher than the boiling point of the solvent contained in the first processing liquid L1 and equal to or lower than the boiling point of the removing agent contained in the first processing liquid L1, is used. In the present embodiment, when two or more types of removing agents are contained in the first processing liquid L1, a thickener having a glass transition point equal to or lower than the boiling point of the removing agent having the lowest boiling point among all the removing agents contained in the first processing liquid L1 is selected. Furthermore, in the present embodiment, when two or more types of solvents are contained in the first processing liquid L1, a thickener having a glass transition point higher than the boiling point of the mixed solution of solvents is selected. However, the relationship between the glass transition point of the thickener and the boiling points of the solvent and the removing agent contained in the first processing liquid L1 is not particularly limited in this embodiment. When heating is performed to a temperature higher than the boiling point of the removing agent to further accelerate the process, the thickener may preferably have a glass transition point equal to or higher than the boiling point of the removing agent contained in the first processing liquid L1.

Figure 7:
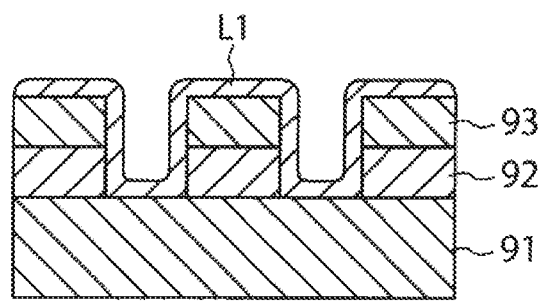
FIG. 7 is a schematic cross-sectional view illustrating a state of a film obtained by supplying a first processing liquid.

By adding the thickener to the first processing liquid L1 to increase the viscosity of the first processing liquid L1, as shown in FIG. 7, the hard mask film 93 can be covered with a film of the first processing liquid L1 formed along the uneven pattern of the substrate W1 (that is, it is possible to perform conformal coating with the first processing liquid L1). Therefore, by adding the thickener to the first processing liquid L1, it is possible to reduce the amount of the first processing liquid L1 used for forming the film of the first processing liquid L1 that covers the hard mask film 93.

The first processing part 4 further includes a second processing liquid supply part 43A configured to supply a liquid (hereinafter referred to as "second processing liquid L1A") for forming a gas diffusion barrier film. The configuration of the second processing liquid supply part 43A is substantially the same as the configuration of the first processing liquid supply part 43. Only the supplied liquid is different. That is, similarly to the first processing liquid supply part 43, the second processing liquid supply part 43A includes a nozzle 431A, a processing liquid source 432A, a valve 433A, and a supply pipeline 434A.

The second processing liquid L1A may be any liquid as long as the film (gas diffusion barrier film) formed by the second processing liquid L1A can capture a gas or a gaseous substance generated by the reaction between the aforementioned first processing liquid L1 and a deposit (removal target), for example, a carbon hard mask on the substrate W1 and can prevent the gas or the gaseous substance from diffusing around the substrate W through the film.

As the second processing liquid L1A, it may be possible to use a liquid obtained by dissolving a polymer satisfying the above requirements in a solvent. Specific examples of the second processing liquid L1A may include a liquid obtained by dissolving methacrylic acid, which is an acrylic polymer contained in an ArF resist, in an organic solvent (specifically, PGME (propylene glycol monomethyl ether), PGMEA (propylene glycol monomethyl ether acetate), CHN (cyclohexanone), EL (ethyl lactone), γ-butyrolactone, etc.), and a liquid obtained by dissolving polyhydroxystyrene, which is a phenolic polymer contained in KrF resist, in an organic solvent (specifically, PGME (propylene glycol monomethyl ether), PGMEA (propylene glycol monomethyl ether acetate), CHN (cyclohexanone), EL (ethyl lactone), γ-butyrolactone, etc.).

The first processing part 4 includes a nozzle moving mechanism 44 configured to drive the nozzles 431 and 431A (the latter is the nozzle of the second processing liquid supply part 43A). The nozzle moving mechanism 44 includes an arm 441, a moving body 442 provided with a built-in driving mechanism and capable of moving along the arm 441, and a swivel lift mechanism 443 configured to swivel and lift the arm 441. The nozzles 431 and 431A are attached to the moving body 442. The nozzle moving mechanism 44 can move the nozzles 431 and 431A between a position above the center of the substrate W1 held by the substrate holding part 42 and a position above the peripheral edge of the substrate W1, and can further move the nozzles 431 and 431A to a standby position located outside a below-described cup 45 in a plan view.

The first processing part 4 includes the cup 45 having a discharge port 451. The cup 45 is provided around the substrate holding part 42 to receive various processing liquids (e.g., a cleaning liquid, etc.) scattered from the substrate W1. The cup 45 is provided with an elevating mechanism 46 configured to drive the cup 45 in the vertical direction, and a liquid discharge mechanism 47 configured to collect and discharge various processing liquids scattered from the substrate W1 through the discharge port 451.

<Configuration of Second Processing Part>

Figure 4:
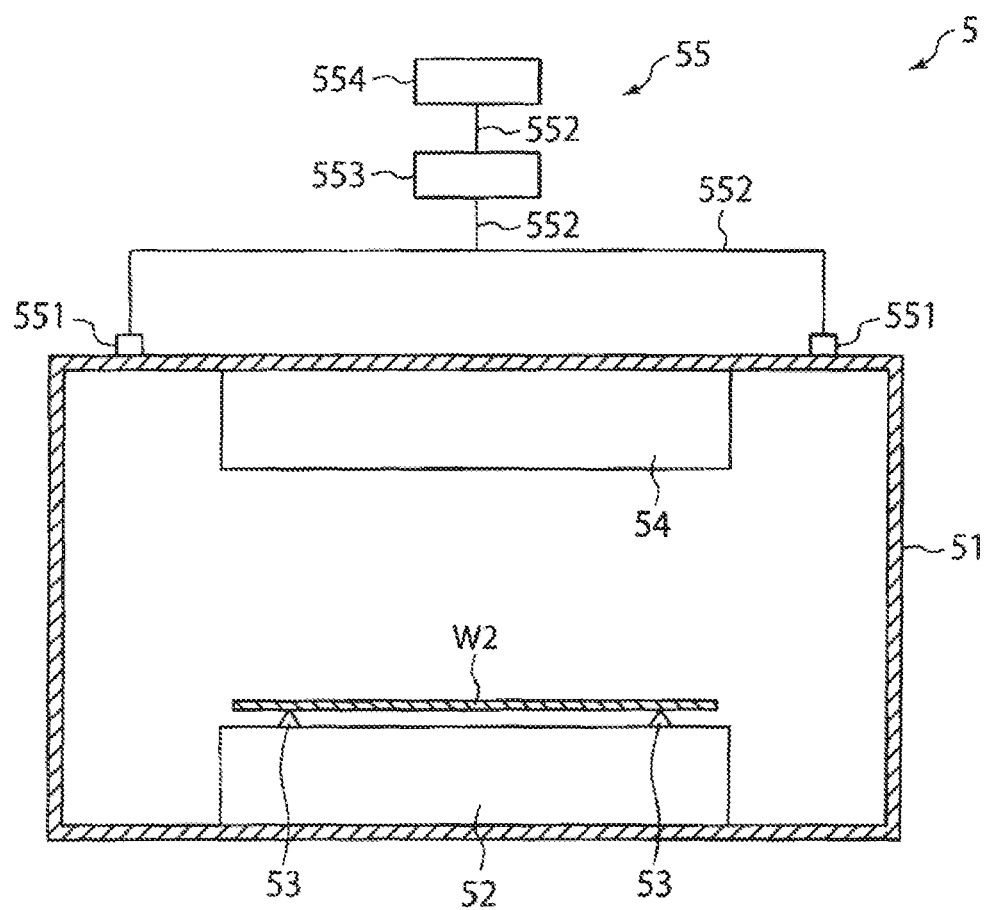
FIG. 4 is a schematic cross-sectional view showing a configuration of a second processing part included in the substrate processing unit shown in FIG. 2.

Next, a configuration of the second processing part 5 will be described with reference to FIG. 4. FIG. 4 is a schematic cross-sectional view showing the configuration of the second processing part 5.

The second processing part 5 performs a process including heating the substrate W2 which has been supplied with the first processing liquid L1. The process performed by the second processing part 5 may include other processes.

The second processing part 5 includes a chamber 51, and performs a substrate process including the heating of the substrate W2 inside the chamber 51.

The second processing part 5 includes a substrate mounting part (stage) 52 provided inside the chamber 51. A heater such as a resistance heating part or a lamp heater (e.g., an LED lamp heater) may be installed in the substrate mounting part 52. A plurality of substrate holding members 53 protrude from the upper surface of the substrate mounting part 52. As the substrate holding members 53 support the peripheral edge portion of the lower surface of the substrate W2, a small gap is formed between the lower surface of the substrate W2 and the upper surface of the substrate mounting part 52.

The second processing part 5 includes a substrate heating part 54 provided above the substrate mounting part 52 inside the chamber 51. The substrate heating part 54 includes a heater such as a resistance heating part or a lamp heater (e.g., an LED lamp heater). The substrate heating part 54 is, for example, a hot plate. The substrate heating part 54 may heat the substrate W2 held on the substrate mounting part 52 by the substrate holding members 53 at a predetermined temperature equal to or higher than the boiling point of the solvent in the first processing liquid L1 and lower than the boiling point of the removing agent. The initial temperature (temperature before heating) of the substrate W2 is, for example, room temperature. The substrate heating part 54 may perform heating at a set temperature for a set time. The substrate heating part 54 may heat the substrate W2 while changing the heating temperature stepwise, or may heat the substrate W2 while maintaining the heating temperature constant. In addition, the substrate heating part 54 may heat the substrate W2 for a sufficient time to accelerate the evaporation of the solvent in the processing liquid L on the substrate W2 and the reaction between the deposit (the hard mask film 93 in the present embodiment) on the substrate and the removing agent.

The chamber 51 is provided with an exhaust part 55 configured to exhaust an internal atmosphere of the chamber 51. The exhaust part 55 includes one or more exhaust ports 551 provided at the upper portion of the chamber 51, a cold trap 553 connected to the exhaust ports 551 through an exhaust duct (exhaust line) 552, and a vacuum pump 554 connected to the cold trap 553 via the exhaust duct (exhaust line) 552. The internal atmosphere of the chamber 51 is discharged from the chamber 51 through the exhaust ports 551 and the exhaust duct 552 suctioned by the vacuum pump 554, so that the solvent evaporated from the substrate W2 is also discharged from the chamber 51 and the evaporated solvent is prevented from re-adhering to the substrate W2.

<Configuration of Third Processing Part>

Figure 5:
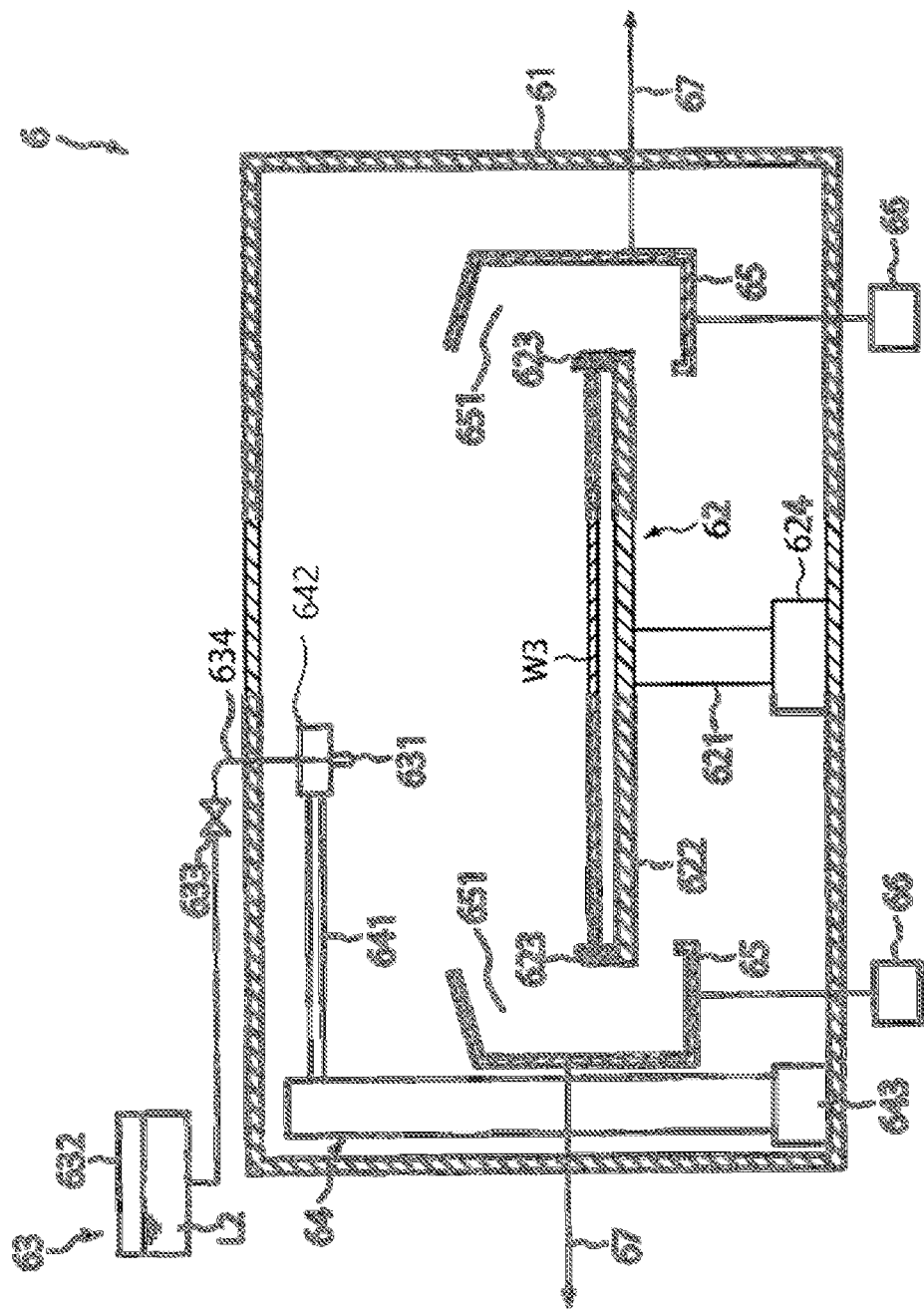
FIG. 5 is a schematic cross-sectional view showing a configuration of a third processing part included in the substrate processing unit shown in FIG. 2.

Next, a configuration of the third processing part 6 will be described with reference to FIG. 5. FIG. 5 is a schematic cross-sectional view showing the configuration of the third processing part 6.

The third processing part 6 performs a process including the supply of a rinsing liquid to the substrate W3 heated after being supplied with the first processing liquid L1. The process performed by the third processing part 6 may include other processes.

The third processing part 6 includes a chamber 61 and performs a substrate process including the supply of the rinsing liquid inside the chamber 61.

The third processing part 6 includes a substrate holding part 62. The substrate holding part 62 includes a rotation shaft 621 extending in the vertical direction inside the chamber 61, a turntable 622 attached to the upper end of the rotation shaft 621, a chuck 623 provided on the outer periphery of the upper surface of the turntable 622 to support the outer edge of the substrate W3, and a drive part 624 configured to rotationally drive the rotation shaft 621. The substrate holding part 62 is rotatable while holding the substrate W3.

The substrate W3 is supported by the chuck 623, and is horizontally held on the turntable 622 while being slightly spaced apart from the upper surface of the turntable 622. In the present embodiment, the method of holding the substrate W3 by the substrate holding part 62 is a so-called mechanical chuck type in which the outer edge portion of the substrate W3 is held by the movable chuck 623. However, the method of holding the substrate W3 by the substrate holding part 62 may be a so-called vacuum chuck type in which the back surface of the substrate W3 is held by vacuum suction.

The base end of the rotation shaft 621 is rotatably supported by the drive part 624, and the tip end of the rotation shaft 621 horizontally supports the turntable 622. As the rotation shaft 621 rotates, the turntable 622 attached to the upper end of the rotation shaft 621 rotates, whereby the substrate W3 held by the turntable 622 while being supported by the chuck 623 rotates. The control unit 3 controls the operation of the drive part 624, and controls the rotation timing, the rotation speed, and the like of the substrate W3.

The third processing part 6 includes a rinsing liquid supply part 63 configured to supply a rinsing liquid L2 to the substrate W3 held by the substrate holding part 62.

The rinsing liquid supply part 63 includes a nozzle 631 configured to discharge the rinsing liquid L2 to the substrate W3 held by the substrate holding part 62, and a rinsing liquid source 632 configured to supply the rinsing liquid L2 to the nozzle 631. The rinsing liquid L2 is stored in the tank of the rinsing liquid source 632. The rinsing liquid L2 is supplied from the rinsing liquid source 632 to the nozzle 631 through a supply pipeline 634 in which a flow rate regulator such as a valve 633 or the like is provided. The third processing part 6 may include a plurality of rinsing liquid supply parts configured to supply different rinsing liquids. The additional rinsing liquid supply parts may be configured similarly to the rinsing liquid supply part 63.

The rinsing liquid L2 may be selected from liquids capable of removing a substance remaining on the substrate W3 from the substrate W3. The substance remaining on the substrate W3 is, for example, the removing agent contained in the first processing liquid L1, the deposit reacted with the removing agent, the thickener, the polymer contained in the second processing liquid L1A, or the like. The thickener and the polymer after heating may be a decomposed product or modified product thereof in some cases. Furthermore, the deposit (the hard mask film 93 in the present embodiment) that has reacted with the removing agent may be a dissolved product, a decomposed product, a modified product, or the like of the deposit in some cases.

The rinsing liquid L2 may include two kinds of rinsing liquids, i.e., a first rinsing liquid suitable for removing a substance derived from the first processing liquid L1 and a second rinsing liquid suitable for removing a substance derived from the second processing liquid L1A. In this case, it is preferable to first supply the second rinsing liquid to the substrate W3 and then supply the first rinsing liquid to the substrate W3. As the first rinsing liquid, for example, water, isopropyl alcohol (IPA), N-methylpyrrolidone (NMP), or the like may be used. When the thickener is methyl cellulose, carboxymethyl cellulose, polyvinyl alcohol, or the like, the rinsing liquid is preferably water. When the thickener is polyethylene glycol, sodium polyacrylate, or the like, the rinsing liquid is preferably NMP. The rinsing liquid L2 supplied to the substrate W3 may have room temperature or may be heated to a temperature higher than room temperature. By supplying the rinsing liquid L2 after heating the same to the temperature higher than the room temperature, it is possible to enhance the rinsing efficiency of the rinsing liquid L2. As the second rinsing liquid, PGME (propylene glycol monomethyl ether), PGMEA (propylene glycol monomethyl ether acetate), CHN (cyclohexanone), EL (ethyl lactone), or the like may be used.

The rinsing liquid L2 may be one kind of rinsing liquid capable of removing the substance derived from the first processing liquid L1 and capable of removing the substance derived from the second processing liquid L1A. Examples of such a rinsing liquid may include TMAH, APM (SC1), cyclopentane, and the like. Examples of the removal target in the case of using such a rinsing liquid may include a carbon hard mask, polyimide, and the like.

In addition, the description on the rinsing liquid may also be applied to a case where the removal target is a deposit other than the hard mask film 93, for example, a case where the removal target is an unnecessary organic, inorganic or organic-inorganic composite film (e.g., a resist film, an antireflection film, or the like) remaining on the substrate after dry etching, a by-product (e.g., a polymer derived from an etching gas, a resist film, a hard mask film, or the like) generated during etching, a resist residue generated during ashing of a resist film, a cured resist layer after ion implantation, or the like.

The third processing part 6 includes a nozzle moving mechanism 64 configured to drive the nozzles 631. The nozzle moving mechanism 64 includes an arm 641, a moving body 642 provided with a built-in driving mechanism and capable of moving along the arm 641, and a swivel lift mechanism 643 configured to swivel and lift the arm 641. The nozzle 631 is attached to the moving body 642. The nozzle moving mechanism 64 can move the nozzle 631 between a position above the center of the substrate W3 held by the substrate holding part 62 and a position above the peripheral edge of the substrate W3, and can further move the nozzle 631 to a standby position located outside a below-described cup 65 in a plan view.

The third processing part 6 includes the cup 65 having a discharge port 651. The cup 65 is provided around the substrate holding part 62 to receive various processing liquids (e.g., a cleaning liquid, etc.) scattered from the substrate W3. The cup 65 is provided with an elevating mechanism 66 configured to drive the cup 65 in the vertical direction, and a liquid discharge mechanism 67 configured to collect and discharge various processing liquids scattered from the substrate W3 through the discharge port 651.

The third processing part 6 may be provided with a drying solvent supply part that includes a nozzle configured to discharge a drying solvent such as isopropyl alcohol (IPA) or the like to the substrate W3 held by the substrate holding part 62, and a drying solvent source configured to supply the drying solvent to the nozzle. In addition, the third processing part 6 may be provided with a drying gas supply part that includes a nozzle configured to discharge a drying gas such as a nitrogen gas, dry air, or the like to the substrate W3 held by the substrate holding part 62, and a drying gas source configured to supply the drying gas to the nozzle.

<Substrate Processing Method>

The substrate processing method executed by the substrate processing apparatus 1 will be described below. The substrate processing method performed by the substrate processing apparatus 1 is a method of removing a hard mask (e.g., carbon hard mask) film on the substrate from the substrate subjected to a dry etching process. In the present embodiment, the hard mask film on the substrate after dry etching is a removal target. However, the hard mask film is merely an example of the deposit on the substrate.

Other specific examples of the deposits on the substrate may include an unnecessary organic, inorganic or organic-inorganic composite film (e.g., a resist film, an antireflection film, or the like) remaining on the substrate after dry etching, a by-product (e.g., a polymer derived from an etching gas, a resist film, a hard mask film, or the like) generated during etching, a resist residue generated during ashing of a resist film, a cured resist layer after ion implantation, and the like.

The substrate processing method executed by the substrate processing apparatus 1 includes:

a process (A) of supplying, to a substrate W 1, a first processing liquid L1 containing a removing agent for a hard mask film 93, a solvent having a boiling point lower than a boiling point of the removing agent, and a thickener;

a process (B) of, after the process (A), supplying a second processing liquid L1A containing an organic polymer to be a gas diffusion barrier film;

a process (C) of, after the process (B), heating the substrate W2 at a predetermined temperature equal to or higher than the boiling point of the solvent contained in the first processing liquid L1 and lower than the boiling point of the removing agent to promote evaporation of the solvent of the first processing liquid L1 on the substrate W2 and reaction between the hard mask film 93 and the removing agent; and a process (D) of, after the process (C), supplying a rinsing liquid L2 to the substrate W3 to remove the hard mask film 93 from the substrate W3.

First, the substrate W1 subjected to a dry etching process is loaded into the first processing part 4. At this time, the transfer mechanism 213 unloads the substrate W1 from the carrier C mounted on the mounting part 211, and mounts the unloaded substrate W1 on the delivery part 214. The transfer mechanism 222 unloads the substrate W1 mounted on the delivery part 214 and loads the unloaded substrate W1 into the first processing part 4.

The substrate W1 loaded into the first processing part 4 is held by the substrate holding part 42. At this time, the substrate holding part 42 horizontally holds the outer edge of the substrate W1 on the turntable 422 while supporting the outer edge of the substrate W1 with the chuck 423. The drive part 424 rotates the substrate W1 held by the substrate holding part 42 at a predetermined speed. The control unit 3 controls the operation of the drive part 424, and controls the rotation timing, the rotation speed, and the like of the substrate W1.

The process (A) is performed on the substrate W1 held by the substrate holding part 42. In the process (A), while rotating the substrate W1 held by the substrate holding part 42 at a predetermined speed, the nozzle 431 of the first processing liquid supply part 43 is located above the center of the substrate W1 to supply the first processing liquid L1 to the substrate W1. At this time, the control unit 3 controls the operation of the first processing liquid supply part 43, and controls the supply timing, the supply time, the supply amount, and the like of the first processing liquid L1. The first processing liquid L1 supplied to the substrate W1 spreads on the surface of the substrate W1 by the centrifugal force generated during the rotation of the substrate W1. Thus, as shown in FIG. 7, the hard mask film 93 is covered with a film of the first processing liquid L1 formed along the uneven pattern of the substrate W1. The first processing liquid L1 scattered from the substrate W1 is discharged via the discharge port 451 of the cup 45 and the liquid discharge mechanism 47. After the supply of the first processing liquid L1 is stopped, the substrate W1 is continuously rotated for a predetermined time, whereby the film of the first processing liquid L1 is cured (at least the fluidity of the film of the first processing liquid L1 is decreased) to such an extent not to hinder execution of the process (B) (for example, the film of the first processing liquid L1 is removed by the second processing liquid L1A).

Figure 8:
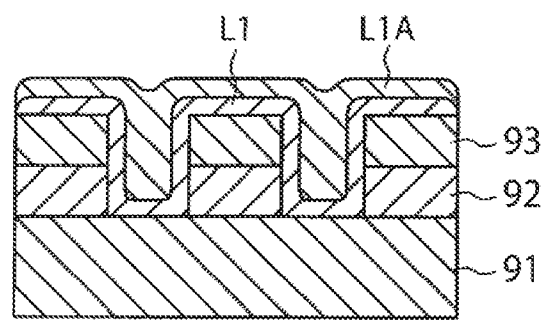
FIG. 8 is a schematic cross-sectional view illustrating a state of a film obtained by supplying a second processing liquid onto a film formed by the first processing liquid.

Subsequently, while rotating the substrate W1 held by the substrate holding part 42 at a predetermined speed, the nozzle 431A of the second processing liquid supply part 43A is located above the center of the substrate W1 to supply the second processing liquid L1A to the substrate W1. At this time, the control unit 3 controls the operation of the second processing liquid supply part 43A, and controls the supply timing, the supply time, the supply amount, and the like of the second processing liquid L1A. The second processing liquid L1A supplied to the substrate W1 spreads on the surface of the film of the first processing liquid L1 by the centrifugal force generated during the rotation of the substrate W1. Thus, as shown in FIG. 8, the film of the first processing liquid L1 is covered with a film of the second processing liquid L1A. After the supply of the second processing liquid L1A is stopped, the substrate W1 is continuously rotated for a predetermined time, whereby the film of the second processing liquid L1A is cured (at least the fluidity of the film of the second processing liquid L1A is decreased) to such an extent not to hinder the transfer of the substrate to the second processing part for executing the process (C).

The substrate W2 that has been subjected to the above process in the first processing part 4 is transferred to the second processing part 5. At this time, the transfer mechanism 222 unloads the substrate W2 from the first processing part 4 and loads the unloaded substrate W2 into the second processing part 5.

The substrate W2 loaded into the second processing part 5 is held on the substrate holding part 52 by the substrate holding member 53.

The process (C) is performed on the substrate W2 held on the substrate holding part 52. In the process (C), while covering the hard mask film 93 with the films of the first processing liquid L1 and the second processing liquid L1A, the substrate heating part 54 heats the substrate W2 to a predetermined temperature equal to or higher than the boiling point of the solvent in the first processing liquid L1 and lower than the boiling point of the removing agent to promote evaporation of the solvent of the first processing liquid L1 on the substrate W2 and reaction between the hard mask film 93 and the removing agent. The heating promotes the reaction between the hard mask film 93 and the removing agent. Furthermore, when the solvent of the first processing liquid L1 on the substrate W2 is evaporated by the heating, the concentration of the removing agent existing at the interface of the hard mask film 93 increases and the removing agent easily diffuses into the hard mask film 93. Therefore, the reaction between the hard mask film 93 and the removing agent is promoted. By promoting the reaction, it becomes possible not only to effectively (e.g., quickly) remove the same removing target as that of the known removing agent, but also to remove the removal target different from that of the known removing agent.

The aforementioned "predetermined temperature equal to or higher than the boiling point of the solvent in the first processing liquid L1 and lower than the boiling point of the removing agent" includes two temperatures, i.e., (1) a temperature equal to or higher than the boiling point of the solvent in the first processing liquid L1 and lower than the glass transition point of the thickener and (2) a temperature equal to or higher than the glass transition point of the thickener in the first processing liquid L1 and lower than the boiling point of the removing agent. The temperature (1) is more preferable than the temperature (2) in that the rinsing efficiency in the process (C) is improved. The temperature (2) is more preferable than the temperature (1) in that the reactivity of the removing agent can be enhanced and the reaction between the hard mask film 93 and the removing agent is promoted.

The substrate heating part 54 may heat the substrate W2 while gradually changing the heating temperature, or may heat the substrate W2 while maintaining the heating temperature constant. The heating time in the substrate heating part 54 is appropriately adjusted to a time sufficient to promote the evaporation of the solvent of the first processing liquid L1 on the substrate W2 and the reaction between the hard mask film 93 and the removing agent. The heating time is usually 60 to 300 seconds, preferably 140 to 160 seconds.

When the hard mask film 93 and the removing agent react with each other, an acidic gas derived from the removing agent (in the case where the removing agent is, for example, hydrochloric acid) or an alkaline gas (in the case where the removing agent is, for example, TMAH) is generated. Most of this gas is captured by the coating film formed by the second processing liquid L1A and does not diffuse into the internal space of the chamber 51. Most of the solvent vapor in the first processing liquid L1 is also captured by the coating film formed by the second processing liquid L1A. Accordingly, what diffuses into the chamber 51 is mainly the vapor of the solvent contained in the second processing liquid L1A.

When a gas derived from an acidic or alkaline removing agent diffuses into the internal space of the chamber 51, the components in the chamber 51 may be corroded by the gas, and the product derived from the gas may adhere, as a contaminant, to the components in the chamber 51, which may cause generation of particles. In the present embodiment, the coating film formed by the second processing liquid L1A prevents such harmful gas from diffusing, so that it is possible to prevent the components in the chamber 51 from corrosion and contamination.

The heating of the substrate W2 is performed while discharging the internal atmosphere of the chamber 51 by the exhaust part 55. The solvent vapor existing in the internal atmosphere of the chamber 51 is discharged from the chamber 51 by the exhaust part 55. Since the solvent vapor easily flows upward in the internal atmosphere of the chamber 51, the exhaust part 55 provided in the upper portion of the chamber 51 can effectively discharge the solvent vapor existing in the internal atmosphere of the chamber 51. Such effective discharge is advantageous in preventing re-adhering of the evaporated solvent to the substrate W2. The gas discharged from the chamber 51 is cooled down when passing through the cold trap 553, and the solvent contained in the gas is liquefied inside the cold trap 553, for example, on the inner wall surface of the cold trap 553. Therefore, the concentration of the solvent contained in the gas flowing into the vacuum pump 554 is low.

The substrate W3 that has been subjected to the above process in the second processing part 5 is transferred to the third processing part 6. At this time, the transfer mechanism 222 unloads the substrate W3 from the second processing part 5, and loads the unloaded substrate W3 into the third processing part 6.

The substrate W3 loaded into the third processing part 6 is held by the substrate holding part 62. At this time, the substrate holding part 62 horizontally holds the substrate W3 on the turntable 622 in a state in which the outer edge of the substrate W3 is supported by the chuck 623. The drive part 624 rotates the substrate W3 held by the substrate holding part 62 at a predetermined speed. The control unit 3 controls the operation of the drive part 624, and controls the rotation timing, the rotation speed, and the like of the substrate W3.

The process (D) is performed on the substrate W3 held by the substrate holding part 62. In the process D, while rotating the substrate W3 held by the substrate holding part 62 at a predetermined speed, the nozzle 631 of the rinsing liquid supply part 63 is located above the center of the substrate W3 to supply the rinsing liquid L2 from the nozzle 631 to the substrate W3. As described above, as the rinsing liquid L2, the second rinsing liquid suitable for removing the substance derived from the second processing liquid L1A and the first rinsing liquid suitable for removing the substance derived from the first processing liquid L1 may be sequentially supplied to the substrate W3, or one kind of rinsing liquid capable of removing the substance derived from the first processing liquid L1 and removing the substance derived from the second processing liquid L1A may be supplied to the substrate W3. At this time, the control unit 3 controls the operation of the rinsing liquid supply part 63, and controls the supply timing, the supply time, the supply amount, and the like of the rinsing liquid L2. The rinsing liquid L2 supplied to the substrate W3 spreads on the surface of the substrate W3 by the centrifugal force generated during the rotation of the substrate W3. As a result, the hard mask film 93 that has reacted with the removing agent is removed from the substrate W3. The rinsing liquid L2 scattered from the substrate W3 is discharged through the discharge port 651 of the cup 65 and the liquid discharge mechanism 67. When substances other than the deposit (the hard mask film in the present embodiment) 93, which has reacted with the removing agent, for example, the removing agent and the thickener included in the first processing liquid L1, the polymer included in the second processing liquid L1A, and the like, remain on the substrate W3, the substances are also removed by the rinsing liquid L2. The thickener and the polymer after heating may be decomposed products or modified products thereof. Furthermore, the deposit (the hard mask film 93 in the present embodiment) that has reacted with the removing agent may be a dissolved product, a decomposed product, a modified product, or the like of the deposit. A drying solvent such as IPA or the like may be supplied to the substrate W3 after supplying the rinsing liquid L2.

The substrate W4 that has been subjected to the above process in the third processing part 6 is taken out from the third processing part 6. At this time, the transfer mechanism 222 unloads the substrate W4 from the third processing part 6 and mounts the unloaded substrate W4 on the delivery part 214. The transfer mechanism 213 takes out the substrate W4 mounted on the delivery part 214 by the transfer mechanism 222 and stores the substrate W4 in the carrier C on the mounting part 211.

Various modifications may be added to the above-described embodiment. Hereinafter, modifications of the above-described embodiment will be described. In addition, it is also possible to combine two or more of the following modifications.

In the above-described embodiment, after the processes (A) and (B) (liquid film formation) are performed on the substrate W in the first processing part 4, the substrate W is transferred from the first processing part 4 to the second processing part 5 so that the process (C) (heating) is performed in the second processing part 5. However, the present disclosure is not limited thereto. All the processes (A) to (C) (rinsing) may be performed in the first processing part 4. In this case, the processing station 22 does not need to include the second processing parts 5, and may be configured by the first processing parts 4 and the third processing parts 6. In this case, the processes (A) to (C) are performed with the substrate held by the substrate holding part 42. Furthermore, in this case, the first processing part 4 is provided with the substrate heating part. The substrate heating part may be provided above the substrate held by the substrate holding part 42 or may be provided below the substrate held by the substrate holding part 42. For example, the substrate heating part may be installed in the turntable 422. The substrate heating part of the first processing part 4 may be configured by, for example, a resistance heating part, a heater such as a lamp heater (e.g., an LED lamp heater), or the like In the above-described embodiment, the substrate W, which has been subjected to the process (C) (heating) in the second processing part 5, is transferred to the third processing part 6 where the substrate W is subjected to the process (D) (rinsing). However, the present disclosure is not limited thereto. The substrate W that has been subjected to the process (C) in the second processing part 5 may be returned to the first processing part 4 where the substrate W may be subjected to the process (D). In this case, the first processing part 4 includes a rinsing liquid supply part. The rinsing liquid supply part of the first processing part 4 may be configured similarly to the rinsing liquid supply part 63 of the third processing part 6. Furthermore, in this case, the processing station 22 does not need to include the third processing parts 6, and may be configured by the first processing parts 4 and the second processing parts 5. The process (C) in the first processing part 4 is performed with the substrate held by the substrate holding part 42.

In the above-described embodiment, all the processes (A) to (D) may be performed in the first processing part 4. In this case, the first processing part 4 includes a substrate heating part and a rinsing liquid supply part as in the modification described above. The processes (A) to (D) are performed with the substrate held by the substrate holding part 42. In this case, the processing station 22 may be composed of only the first processing parts 4.

In the above-described embodiment, the dry etching process described with reference to FIGS. 6A to 6D is performed in an apparatus different from the substrate processing apparatus 1, and the substrate W1 after the dry etching process shown in FIG. 6D is mounted on the mounting part 211. However, the present disclosure is not limited thereto. For example, at least one of the units included in the processing station 22 may have a function of performing the dry etching process, and the transfer mechanism 222 may be configured to directly load the substrate W1 into the first processing part 4 from the respective unit.

Examples

A mixture of tetramethylammonium hydroxide (TMAH), propylene glycol monomethyl ether (PGME), and polyhydroxystyrene was coated on a carbon hard mask film formed on a silicon wafer. The mixing ratio of TMAH, PGME, and polyhydroxystyrene was 3:6:1 (weight ratio). Then, a mixture of polyhydroxystyrene and an organic solvent such as cyclohexanone (CHN) or the like was coated. The mixing ratio of polyhydroxystyrene and organic solvent was 2:8 (weight ratio). After coating, the silicon wafer was heated at 110 degrees C. for 15 seconds, 30 seconds, or 60 seconds. After heating, gas generation was reduced at any heating time. When washed with water or an organic solvent, the carbon hard mask film could be peeled off.

Other Embodiments

Figure 9A:
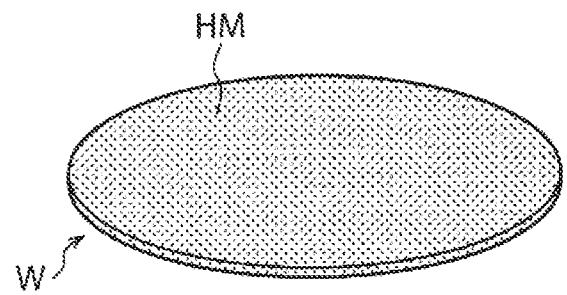
FIGS. 9A to 9D are schematic views illustrating a method of removing a hard mask on the peripheral portion of a substrate.

As another embodiment, a procedure of performing a bevel cut for removing only a film present on a peripheral edge portion from a substrate W having a carbon hard mask HM formed as a film on the entire surface thereof as shown in FIG. 9A will be described.

Figure 9B:
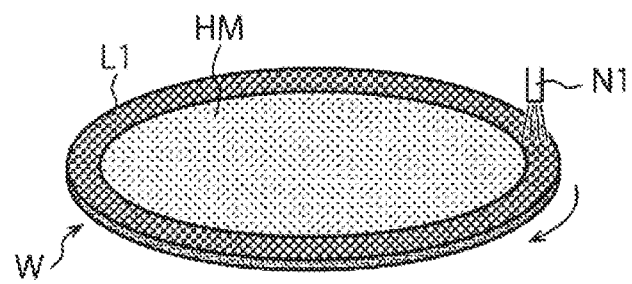

First, as shown in FIG. 9B, the film of the first processing liquid L1 described above is formed only on the peripheral edge portion of the substrate W using a known bevel coater (not shown). Here, as the first processing liquid L1, a liquid containing an oxidizing chemical liquid such as hydrochloric acid or the like as the above-mentioned removing agent is used. The bevel coater holds the substrate W in a horizontal posture with a spin chuck (not shown), rotates the substrate W about the vertical axis, and supplies the first processing liquid L1 to the peripheral edge portion of the rotating substrate W by a nozzle N1, whereby the film of the first processing liquid L1 is formed only on the peripheral edge portion of the substrate W.

Figure 9C:
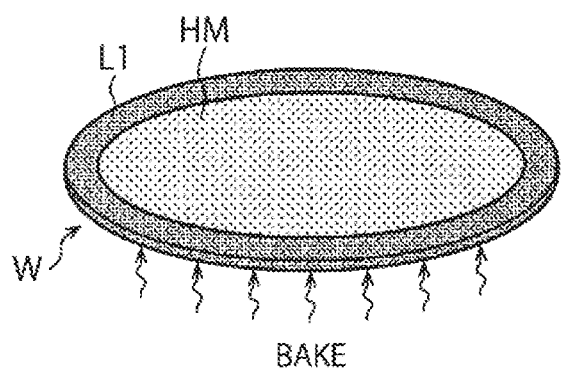

Subsequently, as shown in FIG. 9C, the substrate W is loaded into a bake module (not shown) having the same configuration as that of the second processing part 5, and is heated. As a result, similarly to the above-described process (C), the solvent of the first processing liquid L1 on the substrate W is evaporated, and the reaction between the hard mask and the removing agent is promoted.

Figure 9D:
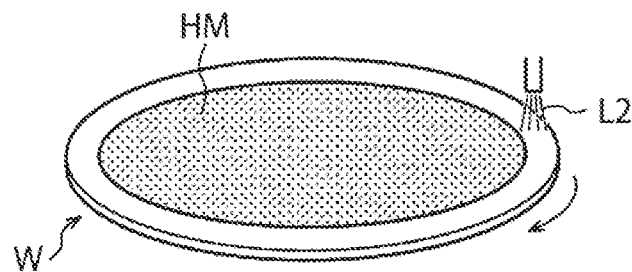

Subsequently, as shown in FIG. 9D, the rinsing liquid L2 described above is supplied to the peripheral edge portion of the substrate W by using a known bevel cleaning apparatus (not shown), and the hard mask HM, which becomes easily removable due to the reaction between the film residue derived from the first processing liquid and the removing agent, is removed. Here, an alkaline chemical liquid is used as the rinsing liquid L2. At this time, the bevel cleaning apparatus holds the substrate W in a horizontal posture with a spin chuck (not shown), rotates the substrate W about the vertical axis, and supplies the rinsing liquid L2 to the peripheral edge portion of the rotating substrate W from a nozzle, thereby removing the hard mask HM, which becomes easily removable due to the reaction between the film residue derived from the first processing liquid and the removing agent. Then, in the bevel cleaning apparatus, for example, pure water, IPA, and the like are supplied to the surface of the substrate W. Thus, the rinsing liquid L2 and the like remaining on the surface of the substrate are removed, and the substrate is dried.

EXPLANATION OF REFERENCE NUMERALS

1: substrate processing apparatus, 2: substrate processing unit, 3: control unit, 4: first processing part, 43: first processing liquid supply part, 43A: second processing liquid supply part, 5: second processing part, 54: substrate heating part, 6: third processing part, 63: rinsing liquid supply part

What is claimed is:

1. A substrate processing apparatus for removing a deposit on a substrate from the substrate, comprising:
    a removal processing part including a first processing liquid supply part configured to supply the substrate with a first processing liquid containing a removing agent for the deposit, a solvent having a boiling point lower than a boiling point of the removing agent, and a thickener, a second processing liquid supply part configured to supply a second processing liquid for forming a gas diffusion barrier film on the substrate to which the first processing liquid is supplied, a substrate heating part configured to heat the substrate, to which the second processing liquid is supplied, at a predetermined temperature equal to or higher than the boiling point of the solvent and lower than the boiling point of the removing agent, and a rinsing liquid supply part configured to supply a rinsing liquid to the substrate; and
    a controller configured to control the first processing liquid supply part, the second processing liquid supply part, the substrate heating part, and the rinsing liquid supply part so that the first processing liquid supply part supplies the first processing liquid to the substrate, subsequently, the second processing liquid supply part supplies the second processing liquid to the substrate, and subsequently, the substrate heating part heats the substrate at the predetermined temperature, so as to promote evaporation of the solvent and reaction between the deposit and the removing agent, and so that the rinsing liquid supply part supplies the rinsing liquid to the substrate, so as to remove the deposit from the substrate,
    wherein the gas diffusion barrier film prevents a gaseous reactive product generated by the reaction between the deposit and the removing agent from diffusing around the substrate.

2. The apparatus of claim 1, wherein the gas diffusion barrier film contains an organic polymer.

3. The apparatus of claim 2, wherein the organic polymer is a phenolic polymer or an acrylic polymer.

4. The apparatus of claim 3, wherein the removing agent includes hydrochloric acid or tetramethylammonium.

5. The apparatus of claim 3, wherein at least two of the first processing liquid supply part, the second processing liquid supply part, the substrate heating part, and the rinsing liquid supply part are accommodated in a same chamber.

6. The apparatus of claim 2, wherein the removing agent includes hydrochloric acid or tetramethylammonium.

7. The apparatus of claim 2, wherein at least two of the first processing liquid supply part, the second processing liquid supply part, the substrate heating part, and the rinsing liquid supply part are accommodated in a same chamber.

8. The apparatus of claim 1, wherein the removing agent includes hydrochloric acid or tetramethylammonium.

9. The apparatus of claim 8, wherein at least two of the first processing liquid supply part, the second processing liquid supply part, the substrate heating part, and the rinsing liquid supply part are accommodated in a same chamber.

10. The apparatus of claim 8, wherein the deposit is a hard mask film for etching.

11. The apparatus of claim 1, wherein at least two of the first processing liquid supply part, the second processing liquid supply part, the substrate heating part, and the rinsing liquid supply part are accommodated in a same chamber.

12. The apparatus of claim 1, wherein the deposit is a hard mask film for etching.

13. A substrate processing method of removing a deposit on a substrate from the substrate, the method comprising:
 (A) supplying to the substrate a first processing liquid containing a removing agent for the deposit, a solvent having a boiling point lower than a boiling point of the removing agent, and a thickener;
 (B), after (A), supplying to the substrate a second processing liquid containing an organic polymer to be a gas diffusion barrier film;
 (C), after (B), heating the substrate at a predetermined temperature equal to or higher than the boiling point of the solvent and lower than the boiling point of the removing agent to promote evaporation of the solvent and reaction between the deposit and the removing agent; and
 (D), after (C), supplying a rinsing liquid to the substrate to remove the deposit from the substrate,
 wherein the gas diffusion barrier film prevents a gaseous reactive product generated by the reaction between the deposit and the removing agent in (C) from diffusing around the substrate.

14. The method of claim 13, wherein the gas diffusion barrier film contains an organic polymer.

15. The method of claim 14, wherein the organic polymer is a phenolic polymer or an acrylic polymer.

16. The method of claim 13 wherein the organic polymer is a phenolic polymer or an acrylic polymer.

17. The method of claim 13, wherein the removing agent includes hydrochloric acid or tetramethylammonium.

18. The method of claim 13, wherein at least two of (A) to (D) are performed inside a same chamber.

19. The method of claim 13, wherein the deposit is a hard mask film for etching.

20. A storage medium storing a program that, when executed by a computer for controlling an operation of a substrate processing apparatus, causes the computer to control the substrate processing apparatus to execute the substrate processing method of claim 13.

* * * * *